RADIATION SENSITIVE OPTICAL LOGIC ELEMENT USING PHOTOCHROMIC LAYERS

Filed Feb. 28, 1966

INVENTOR.
JUDEA PEARL

BY John V. Regan

Attorney

United States Patent Office 3,402,300

Patented Sept. 17, 1968

3,402,300

RADIATION SENSITIVE OPTICAL LOGIC ELEMENT USING PHOTOCHROMIC LAYERS

Judea Pearl, Kendall Park, N.J., assignor to Radio Corporation of America, a corporation of Delaware Filed Feb. 28, 1966, Ser. No. 530,290
5 Claims. (Cl. 250—220)

ABSTRACT OF THE DISCLOSURE

An optical logic system for data handling using photochromic layers exhibiting a plurality of stable absorption spectra selected by an input radiation wavelength. The photochromic layers are sequentially deposited on transparent substrates which can be arranged in series in an optical path to provide sequential logic operations.

*Background of the invention*

In the field of data processing, a basic building block is a signal amplifying device which is used to amplify and to transfer an input signal applied thereto. A pair of these devices are interconnected as a logic element which is arranged to have two stable operating states with a transition between the states being effected by an input signal applied to the amplifying devices. This composite logic element is referred to as a "flip-flop." Electronic flip-flops, amplifiers and logic elements, are well-known and are used for counting or responding to input signals applied thereto. However, because of operational and structural limitations inherent in electronic devices, specific applications of data-handling elements have made other types of logic and amplifying devices desirable. Such devices have been electromechanical and mechanical in nature. However, these elements have exhibited serious shortcomings owing to mechanical movements found therein. Accordingly, recent attempts to overcome these problems and to provide a substitute for the electronic amplifiers and logic elements have resulted in other types of logic elements which are arranged to perform logical operations on input signals. These prior art devices, however, have several serious problems including a low speed of operation, which prevent it from being utilized in many data-handling and signal amplifying operations. Accordingly, a signal amplifying and logic element to replace the aforesaid substitutes for the electronic data-handling devices which operate without the deficiencies of the prior art devices would be of significant utility in the data-handling field.

An object of the present invention is to provide a signal amplifying device.

Another object of the present invention is to provide an improved logic element.

Another object of the present invention is to provide an improved optical input signal amplifying and logic device.

Still another object of the present invention is to provide an improved optical logic element having an input radiation amplifying capability.

A further object of the present invention is to provide an optical flip-flop device.

A still further object of the present invention is to provide an optical storage element having non-destructive read-out and inherent radiation amplifying capability.

*Summary of the invention*

In accomplishing these and other objects, there has been provided, in accordance with the present invention, a light amplifier and logic element comprising a pair of photochromic layers deposited on a transparent substrate. A first layer has two stable absorption spectra which can be selected by the application of a corresponding input radiation wavelength. The second layer has two absorption bands encompassing the input wavelengths for the first layer. The device has an inherent radiation amplifying property derived from the modulation of a bias radiation input by a weak control radiation affecting the stable states in the first layer.

*Brief description of the drawings*

A better understanding of the present invention may be had when the following detailed description is read in connection with the accompanying drawings in which.

*Detailed description*

Figure 1:
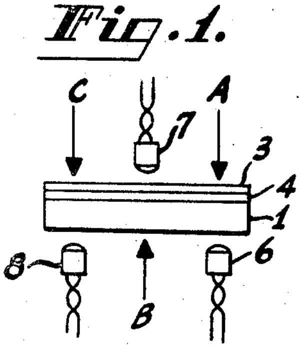
FIGURE 1 is a pictorial illustration of a light amplifier and logic device embodying the present invention.
Figure 4:
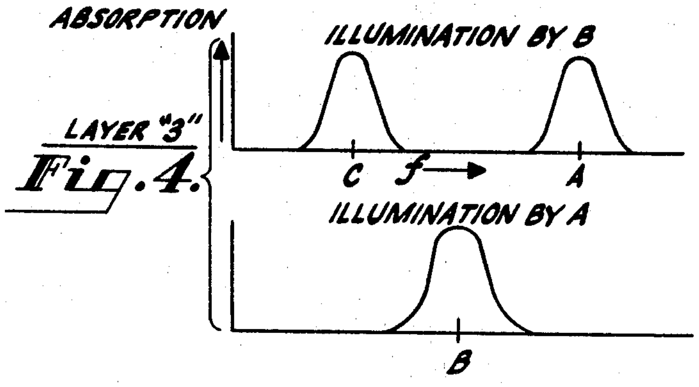
FIGURES 4 and 5 are respective absorption spectra curves for the two types of materials used in the present invention.
Figure 5:
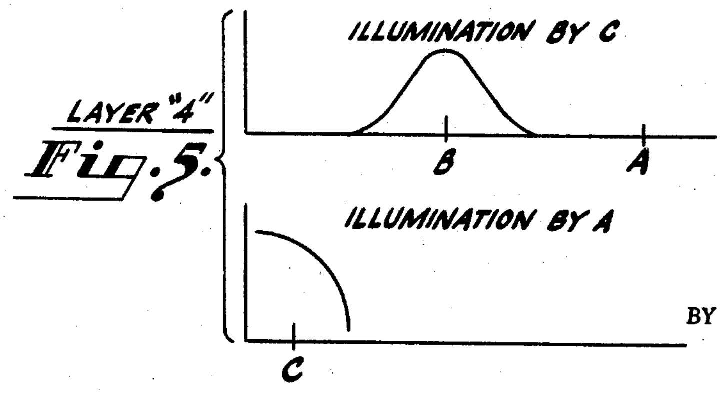

Referring to FIGURE 1 in more detail, there is shown a transparent substrate 1 having two superimposed layers 3, 4 of photochromic material. The absorption spectra characteristics of these layers are shown in FIGURES 4 and 5. Specifically, the absorption spectra or bands of layer 3 is present in two stable states which are relatively changed upon illumination by radiation of wavelength A or B but are unaffected by radiation of wavelength C. A suitable material for this layer is $CaF_2$:Ce (calcium fluoride doped with cerium). Layer 4, on the other hand has two absorption bands spectra with one containing wavelength B and the other containing wavelength C. A suitable material for this layer is KCL (potassium chloride). Assume an equilibrium absorption of the layers 3 and 4 under a bias illumination of the three wavelengths. If the intensity of radiation A is increased, the transmittance of layer 3 to radiation C is proportionally increased. This action increases the intensity of radiation C reaching the second layer 4. The effect of this increase in radiation C is to make layer 4 more opaque; i.e., to decrease the transmittance to radiation B which, in turn, is effective to further decrease the intensity of wavelength B reaching layer 3. Finally, by this regenerative action, the combined layers 3, 4 could become effectively opaque to radiation B and fully transparent to radiation C and A. The optical loop gain can be shown to be $$\text{Gain}=\frac{\partial I_3(C)\text{ out}}{\partial I_3(B)\text{ in}}\times\frac{\partial I_4(B)\text{ out}}{\partial I_4(C)\text{ in}}$$

i.e., the change in output C radiation intensity per unit change in input B radiation of layer 3 times the change in output B radiation per unit change in input C radiation of layer 4. By increasing the bias of radiation, the first term can be as large as required to provide a loop gain greater than unity. The amplification is derived from the fact that in layer 3, a single absorption center induced by radiation B can scatter many photons of radiation C without being overcome. It can, thus, be shown that the response of the device of the present invention is a function of the bias light C.

Since the aforesaid operation is reversible by increasing the intensity of radiation B, it may be seen that the device of the present invention functions in the manner of a "flip-flop." Thus, a pulse of radiation A will lock the device in state of transparency to A, and, conversely, a pulse of radiation B will lock the device in a transparent state to radiation B. A pair of photodetectors 6, 7 may be positioned to detect the levels of radiations A and B, respectively, to provide an electrical output from the "flip-flop." If it is desired to detect the incoming signal represented by radiation B, a photodetector 8 may be positioned to detect the transmission of radiation C through the layers 3, 4. Since a weak input of radiation B will affect the absorption state in layer 3, the relatively strong radiation C will be modulated thereby to produce an amplified output signal on detector 8 indicative of the absorption state of layer 3.

Figures 2, 3:
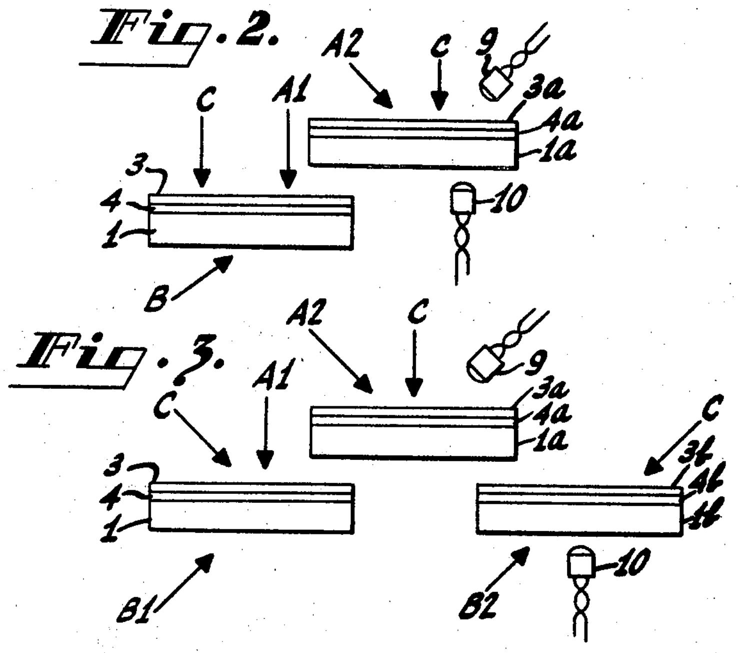
FIGURE 2 is a pictorial illustration of a modification of the structure shown in FIGURE 1.
FIGURE 3 is a pictorial representation of a further modification of the structure shown in FIGURES 1 and 2.

The logical configuration of the optical flip-flop of the present invention may be extended to include a plurality of similar flip-flop devices arranged to receive radiation transmitted through preceding devices arranged in serial fashion to form a counter or other logical network as shown in FIGURES 2 and 3. The photodetectors 8, 9 may be used to provide electrical output signals at the end of the logical network. Thus, the input radiation A1, A2, B1, B2 is an effective change in the absorption states of the related optical flip-flops in a logical chain fashion.

Accordingly, it may be seen that there has been provided, in accordance with the present invention, an optical flip-flop and light amplifying device having regenerative switching between two stable radiation absorbing states with non-destructive readout of a stored radiation absorbing state.

What is claimed is:

1. A radiation amplifier comprising a photochromic material having two stable radiation absorption spectra, a first radiation source operative to produce a first absorption spectrum of said two spectra in said material, a second radiation means operative to produce a second absorption spectrum of said two spectra in said material and detecting signal means comprising a bias source of radiation having no effect on the presence of said two absorption spectra of said material and having a wavelength included in said first spectrum and not in said second spectrum and also comprising a photodetector means arranged to detect the transmission of radiation from said bias source through said material.

2. A radiation amplifier as set forth in claim 1 wherein said material is calcium fluoride doped with cerium.

3. An optical flip-flop comprising a first layer of photochromic material having two stable absorption spectra, a second layer of photochromic material superimposed on said layer and having two absorption bands, a first radiation source arranged to induce a first one of said two absorption spectra in said first layer, a second radiation source arranged to illuminate said first layer through said second layer to induce a second one of said two absorption spectra and a third radiation source passing through said first layer and said second layer and having a wavelength falling in said second absorption spectrum, said third radiation source being operative to produce an absorption band in said second layer for absorbing radiation from said second source but ineffective to alter said two spectra of said first layer.

4. An optical flip-flop as set forth in claim 3 wherein said first layer is calcium fluoride doped with cerium and said second layer is potassium chloride.

5. An optical flip-flop as set forth in claim 3 and including a pair of radiation detectors arranged to detect radiation from said first source and said second source, respectively, after transmission through said first and second layers.

References Cited

UNITED STATES PATENTS

| | | | |
|---|---|---|---|
| 3,085,469 | 4/1963 | Carlson | 250—217 X |
| 3,174,537 | 3/1965 | Meyer | 350—160 X |
| 3,304,433 | 2/1967 | Hamann | 250—209 X |

WALTER STOLWEIN, *Primary Examiner.*